(12) United States Patent
Kim et al.

(10) Patent No.: US 10,903,395 B2
(45) Date of Patent: Jan. 26, 2021

(54) SEMICONDUCTOR DEVICE HAVING VARYING CONCENTRATIONS OF ALUMINUM

(71) Applicant: LG INNOTEK CO., LTD., Seoul (KR)

(72) Inventors: Byeong Jo Kim, Seoul (KR); Rak Jun Choi, Seoul (KR); Hyun Jee Oh, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 15/821,519

(22) Filed: Nov. 22, 2017

(65) Prior Publication Data

US 2018/0145219 A1    May 24, 2018

(30) Foreign Application Priority Data

Nov. 24, 2016 (KR) .................. 10-2016-0157704

(51) Int. Cl.
*H01L 33/32* (2010.01)
*H01L 33/02* (2010.01)
(Continued)

(52) U.S. Cl.
CPC ............ *H01L 33/32* (2013.01); *H01L 33/007* (2013.01); *H01L 33/0025* (2013.01);
(Continued)

(58) Field of Classification Search
CPC ..................................................... H01L 33/32
See application file for complete search history.

(56) References Cited

U.S. PATENT DOCUMENTS 4,910,571 A    3/1990 Kasahara et al.
5,153,990 A   10/1992 Sugawara
(Continued)

FOREIGN PATENT DOCUMENTS

EP    1 385 215 A2    1/2004
EP    1 453 160       9/2004
(Continued)

OTHER PUBLICATIONS

U.S. Ex Parte Quayle Office Action dated Apr. 26, 2018 issued in co-pending U.S. Appl. No. 15/692,617.
(Continued)

*Primary Examiner* — Lex H Malsawma
*Assistant Examiner* — Geoffrey H Ida
(74) *Attorney, Agent, or Firm* — KED & Associates, LLP

(57) ABSTRACT

A light emitting structure that includes: first and second semiconductor layers having aluminum; and an active layer having aluminum between the first and the second semiconductor layers, the intensity exhibited in the second semiconductor layer range between a first minimum intensity of the secondary ions and a first maximum intensity of the secondary ions, and the intensity exhibited in the first semiconductor layer include a second minimum intensity of the secondary ions, the second minimum intensity being different from the first minimum intensity, and at a first prescribed distance from a surface of the second semiconductor layer, the second semiconductor layer exhibits a first intermediate intensity of the secondary ions corresponding to the second minimum intensity, which is between the first minimum intensity and the first maximum intensity, wherein the first maximum intensity occurs at a second prescribed distance from the first prescribed distance, wherein a ratio of the second prescribed distance (W1) to the first prescribed distance (W2) is within a range of 1:0.2 to 1:1.

18 Claims, 6 Drawing Sheets

(51) Int. Cl.
*H01L 33/00* (2010.01)
*H01L 33/06* (2010.01)
*H01L 33/14* (2010.01)
*H01L 33/38* (2010.01)

(52) U.S. Cl.
CPC ............ *H01L 33/025* (2013.01); *H01L 33/06* (2013.01); *H01L 33/145* (2013.01); *H01L 33/325* (2013.01); *H01L 33/382* (2013.01)

(56) References Cited

U.S. PATENT DOCUMENTS

| | | | |
|---|---|---|---|
| 6,614,119 | B1 | 9/2003 | Asahina et al. |
| 6,777,253 | B2 | 8/2004 | Ishibashi |
| 7,065,117 | B2 | 6/2006 | Yamanaka |
| 8,154,042 | B2 | 4/2012 | Aldaz et al. |
| 8,269,410 | B2 | 9/2012 | Kijima et al. |
| 8,476,666 | B2 | 7/2013 | Kim et al. |
| 8,488,644 | B2 | 7/2013 | Imai |
| 8,969,898 | B2 | 3/2015 | Onishi et al. |
| 8,994,001 | B2 | 3/2015 | Son |
| 9,276,167 | B2 | 3/2016 | Hoppel |
| 9,401,452 | B2 | 7/2016 | Northrup |
| 9,450,151 | B2 | 9/2016 | Choi et al. |
| 9,537,055 | B2 | 1/2017 | Park |
| 9,540,252 | B1 | 1/2017 | Collins et al. |
| 9,590,141 | B2 | 3/2017 | Tachibana et al. |
| 9,711,682 | B2 | 7/2017 | Han |
| 9,748,410 | B2 | 8/2017 | Kinoshita et al. |
| 10,347,804 | B2 | 7/2019 | Yoo |
| 2002/0088985 | A1 | 7/2002 | Komoto |
| 2003/0006418 | A1* | 1/2003 | Emerson ............ H01L 21/0237 257/79 |
| 2003/0141506 | A1 | 7/2003 | Sano et al. |
| 2005/0127391 | A1 | 6/2005 | Yanamoto |
| 2005/0179045 | A1 | 8/2005 | Ryu et al. |
| 2006/0131558 | A1 | 6/2006 | Sato et al. |
| 2006/0260671 | A1 | 11/2006 | Ohta et al. |
| 2007/0023777 | A1 | 2/2007 | Sonobe et al. |
| 2007/0205375 | A1 | 9/2007 | Ward et al. |
| 2008/0061308 | A1 | 3/2008 | Yoon |
| 2008/0185606 | A1 | 8/2008 | Sano et al. |
| 2008/0247435 | A1 | 10/2008 | Choi |
| 2010/0006884 | A1 | 1/2010 | Ou et al. |
| 2010/0051987 | A1 | 3/2010 | Katsuno et al. |
| 2010/0096652 | A1 | 4/2010 | Choi et al. |
| 2011/0266568 | A1 | 11/2011 | Aldaz et al. |
| 2011/0316126 | A1 | 12/2011 | Emura et al. |
| 2012/0040480 | A1 | 2/2012 | Shieh et al. |
| 2012/0049156 | A1 | 3/2012 | Ohta et al. |
| 2012/0085986 | A1 | 4/2012 | Iwanaga et al. |
| 2012/0112218 | A1 | 5/2012 | Teng et al. |
| 2012/0141771 | A1* | 6/2012 | Pan ................. B32B 18/00 428/312.8 |
| 2013/0082237 | A1* | 4/2013 | Northrup ........... H01L 33/32 257/13 |
| 2014/0034981 | A1 | 2/2014 | Hung et al. |
| 2014/0084274 | A1 | 3/2014 | Yamazaki et al. |
| 2014/0219304 | A1 | 8/2014 | Lee et al. |
| 2014/0225143 | A1 | 8/2014 | Kususe |
| 2014/0239341 | A1 | 8/2014 | Matsumura |
| 2014/0327034 | A1 | 11/2014 | Toyota |
| 2015/0263305 | A1* | 9/2015 | Premutico ......... H01L 51/5012 257/40 |
| 2015/0311392 | A1 | 10/2015 | Hirayama et al. |
| 2015/0380621 | A1 | 12/2015 | Chae et al. |
| 2016/0005919 | A1 | 1/2016 | Obata |
| 2016/0056338 | A1 | 2/2016 | Park et al. |
| 2016/0111600 | A1 | 4/2016 | Chae et al. |
| 2016/0149078 | A1* | 5/2016 | Takeuchi ........... H01S 5/3202 257/13 |
| 2016/0218262 | A1 | 7/2016 | Aketa et al. |
| 2016/0284941 | A1 | 9/2016 | Seo et al. |
| 2017/0025566 | A1 | 1/2017 | Song et al. |
| 2017/0098736 | A1 | 4/2017 | Lee |
| 2017/0170360 | A1 | 6/2017 | Bour |
| 2017/0317236 | A1 | 11/2017 | Lee et al. |
| 2018/0069150 | A1 | 3/2018 | Oh et al. |
| 2018/0076355 | A1 | 3/2018 | Hayashi et al. |
| 2018/0145219 | A1 | 5/2018 | Kim et al. |
| 2018/0151778 | A1 | 5/2018 | Park et al. |
| 2019/0326473 | A1 | 10/2019 | Choi et al. |

FOREIGN PATENT DOCUMENTS

| | | |
|---|---|---|
| EP | 2 955 763 | 12/2015 |
| EP | 2 988 339 | 2/2016 |
| EP | 3 043 395 | 7/2016 |
| EP | 3 073 539 | 9/2016 |
| EP | 3 291 314 | 3/2018 |
| JP | H 07-106631 | 4/1995 |
| JP | 2001-203385 | 7/2001 |
| JP | 2003-110140 | 4/2003 |
| JP | 2003-115642 | 4/2003 |
| JP | 2004-104157 | 4/2004 |
| JP | 2006-032779 | 2/2006 |
| JP | 2007-134533 | 5/2007 |
| JP | 2008-285758 | 11/2008 |
| JP | 2010-171272 | 8/2010 |
| JP | 2012-049337 | 3/2012 |
| JP | 2012-216603 | 11/2012 |
| JP | 2013-105917 | 5/2013 |
| JP | 2013-149889 | 8/2013 |
| JP | 2014-241397 | 12/2014 |
| JP | 2015-216352 | 12/2015 |
| JP | 2016-044095 | 4/2016 |
| JP | 2016-066691 | 4/2016 |
| JP | 2016-084822 | 5/2016 |
| JP | 2016-184724 | 10/2016 |
| JP | 2016-213448 | 12/2016 |
| KR | 2010-0044726 | 4/2010 |
| KR | 10-2014-0006429 | 1/2014 |
| KR | 10-1458389 | 11/2014 |
| KR | 2016-0062659 | 6/2016 |
| KR | 2016-0105126 | 9/2016 |
| KR | 2016-0117010 | 10/2016 |
| WO | WO 2005/101532 | 10/2005 |
| WO | WO 2006/043422 | 4/2006 |
| WO | WO 2010/146808 | 12/2010 |
| WO | WO 2014/123092 | 8/2014 |
| WO | WO 2015/156588 | 10/2015 |
| WO | WO 2016/004374 A1 | 1/2016 |
| WO | WO 2016/159638 | 10/2016 |
| WO | WO 2016/163083 | 10/2016 |
| WO | WO 2017/049053 | 3/2017 |

OTHER PUBLICATIONS

U.S. Office Action dated Aug. 31, 2018 issued in co-pending U.S. Appl. No. 15/692,617.
European Search Report issued in Application EP 17 18 8926 dated Dec. 21, 2017.
Extended European Search Report issued in Application 17203483.7 dated Mar. 28, 2018.
U.S. Office Action dated May 17, 2019 issued in related U.S. Appl. No. 16/100,785.
European Search Report dated Dec. 13, 2018 issued in Application No. 18188482.6.
United States Notice of Allowance dated Feb. 15, 2019 issued in co-pending related U.S. Appl. No. 15/692,617.
European Search Report dated May 14, 2019 issued in Application No. 17815692.3.
European Search Report dated Jul. 11, 2019 issued in EP Application No. 17849159.3.
Japanese Office Action dated Oct. 8, 2019 issued in Application No. 2018-152495.
United States Office Action dated Dec. 19, 2019 issued in co-pending related U.S. Appl. No. 16/310,340.
European Search Report dated Jul. 24, 2019 issued in EP Application No. 17851126.7
U.S. Notice of Allowance dated Oct. 23, 2019 issued in co-pending U.S. Appl. No. 16/100,785.

(56) References Cited

OTHER PUBLICATIONS

U.S. Appl. No. 16/100,785, filed Aug. 10, 2018.
Japanese Office Action dated Sep. 3, 2019 issued in Application JP 2017-168498.
European Office Action dated May 7, 2020 issued in EP Application No. 17849159.3.
Japanese Office Action dated Feb. 4, 2020 issued in Application No. 2018-152495.
U.S. Appl. No. 16/415,245, filed May 17, 2019.
U.S. Appl. No. 16/310,340, filed Dec. 14, 2018.
U.S. Appl. No. 16/331,015, filed Mar. 6, 2019.
U.S. Appl. No. 15/821,519, filed Nov. 22, 2017.
U.S. Appl. No. 16/331,039, filed Mar. 6, 2019.
U.S. Appl. No. 16/331,039, Mar. 6, 2009.
United States Office Action dated May 22, 2020 issued in co-pending related U.S. Appl. No. 16/415,245.
United States Notice of Allowance dated Oct. 16, 2020 issued in co-pending related U.S. Appl. No. 16/415,245.

* cited by examiner

SEMICONDUCTOR DEVICE HAVING VARYING CONCENTRATIONS OF ALUMINUM

CROSS-REFERENCE TO RELATED APPLICATION

This application claims priority under 35 U.S.C. § 119 to Korean Application No. 10-2016-0157704 filed on Nov. 24, 2016, whose entire disclosure is hereby incorporated by reference.

BACKGROUND

1. Field

Embodiments of the present disclosure relate to a semiconductor device and a semiconductor device package including the same.

2. Background

Since a semiconductor device including a compound such as GaN and AlGaN has many advantages such as having energy with a wide and easily adjustable bandgap and the like, the semiconductor device can be variously used as a light emitting device, a light receiving device, various diodes, and the like.

Specifically, a light emitting device such as a light emitting diode (LED) or a laser diode using a Group III-V or II-VI compound semiconductor material has advantages in that, since a thin film growing technology and an element material have been developed, various colors such as a red color, a green color, a blue color, and an ultraviolet (UV) color can be expressed, white light can be generated with high efficiency using a fluorescent material or by mixing colors, and low power consumption, a semi-permanent lifetime, a fast response time, safety, and environmental friendliness can be achieved in comparison to a conventional light source such as a fluorescent lamp and an incandescent lamp.

In addition, when a light receiving device such as a photodetector or a solar cell is manufactured using a Group III-V or II-VI compound semiconductor material, the light receiving element according to the development of an element material generates a photocurrent by absorbing light in various wavelength regions so that light in various wavelength regions from a gamma ray region to a radio wavelength region can be used. Further, since the light receiving element has advantages of having a fast response speed, safety, environmental friendliness, and easy control of an element material, the light emitting device can also be easily used for power control, a microwave circuit, or a communication module.

Accordingly, application of the semiconductor device has expanded to being applied as a transmission module of an optical communication device, a light emitting diode (LED) backlight replacing a cold cathode fluorescent lamp (CCFL) that configures a backlight of a liquid crystal display (LCD) device, a white LED lighting device capable of replacing a fluorescent lamp or an incandescent lamp, a headlight of a vehicle, a traffic light, a sensor for sensing gas or fire, and the like. In addition, the application of the semiconductor device may be expanded to a high frequency application circuit, another power control device, and a communication module.

Specifically, a light emitting device configured to emit light in a UV wavelength region can be used for curing, medical, and germicidal applications due to a curing action and a bactericidal action.

Recently, research on a UV light emitting device is actively ongoing, but there are problems in that it is difficult to implement a vertical UV light emitting device and light output is degraded when a GaN thin film is used for an ohmic characteristic.

BRIEF DESCRIPTION OF THE DRAWINGS

The embodiments will be described in detail with reference to the following drawings in which like reference numerals refer to like elements wherein.

DETAILED DESCRIPTION

The present embodiments may be modified in other forms or various embodiments may be combined, and the scope of the present disclosure is not limited to each embodiment that will be described below.

Although an item described in a specific embodiment is not described in another embodiment, the item may be understood as being related to the other embodiment unless otherwise described in the other embodiment or where there are no contradictory explanations therein.

For example, when a feature for a configuration A is described in a specific embodiment and a feature for a configuration B is described in another embodiment, even when an embodiment in which the configuration A and the configuration B are combined is not explicitly described it should be understood that such an embodiment falls within the scope of the present disclosure unless otherwise described in the other embodiment or when there are no contradictory explanations therein.

In the description of the embodiments, when an element is described as being formed "on" or "under" another element, the terms "on" or "under" include the meaning of the two components being in direct contact with each other and the meaning of one or more other components being indirectly disposed and formed between the two components. Further, when an element is described as being formed "on" or "under" another element, the description may include the meaning of the other element being "formed in an upward direction of the element" and "formed in a downward direction of the element."

Hereinafter, embodiments of the present disclosure will be fully described in detail which is suitable for implementation by those skilled in the art with reference to the accompanying drawings.

A light emitting structure according to an embodiment of the present disclosure may output light in an ultraviolet (UV) wavelength range. For example, the light emitting structure may emit light in a near-UV wavelength range (UV-A), light in a far-UV wavelength range (UV-B), or light in a deep-UV wavelength range (UV-C). The wavelength range may be determined by an aluminum (Al) composition ratio of a light emitting structure 120.

For example, the UV-A may have a wavelength in a range of 320 nm to 420 nm, the UV-B may have a wavelength in a range of 280 nm to 320 nm, and the UV-C may have a wavelength in a range of 100 nm to 280 nm.

Figure 1:
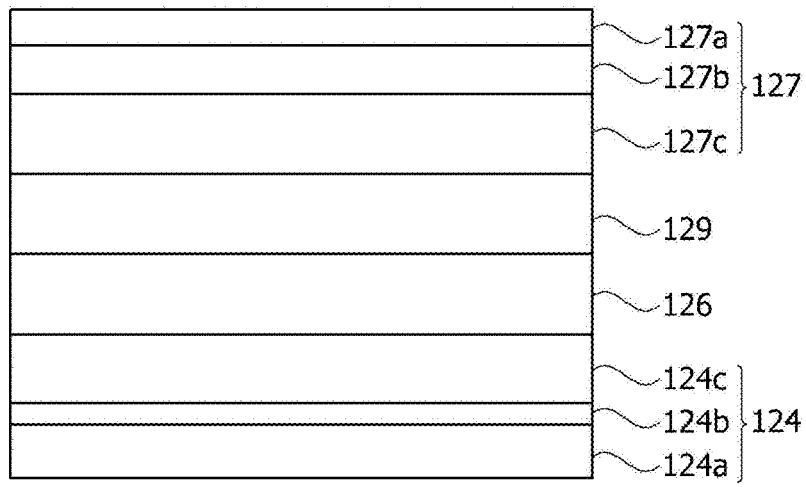
FIG. 1 is a conceptual diagram of a light emitting structure according to one embodiment of the present disclosure.
Figure 2:
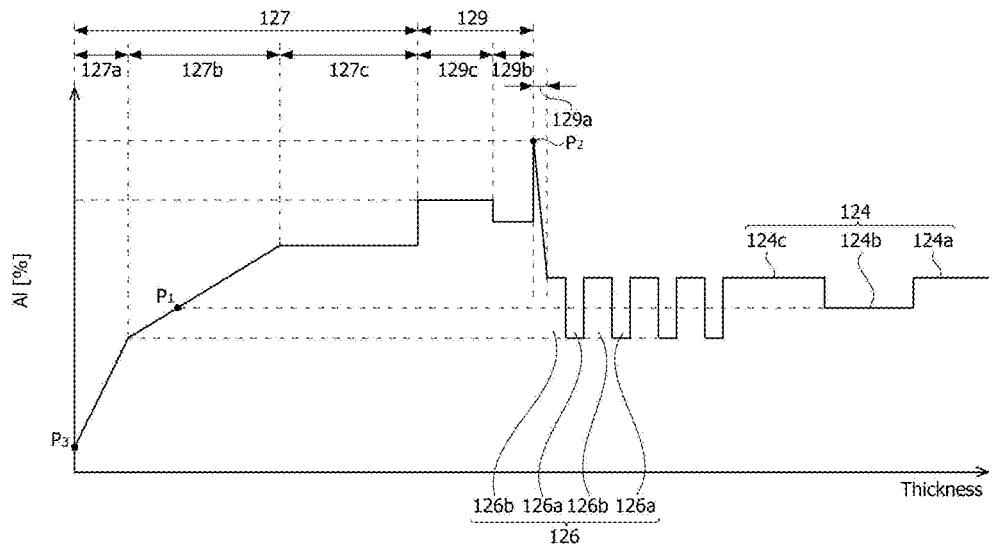
FIG. 2 is a graph illustrating an aluminum (Al) composition ratio of the light emitting structure according to one embodiment of the present disclosure.

FIG. 1 is a conceptual diagram of a light emitting structure according to one embodiment of the present disclosure, and FIG. 2 is a graph illustrating an Al composition ratio of the light emitting structure according to one embodiment of the present disclosure.

Referring to FIG. 1, a semiconductor device according to the present embodiment includes the light emitting structure 120 having a first conductive semiconductor layer 124, a second conductive semiconductor layer 127, and an active layer 126 disposed between the first conductive semiconductor layer 124 and the second conductive semiconductor layer 127.

The first conductive semiconductor layer 124 may be formed of a Group III-V or II-VI compound semiconductor, and may be doped with a first dopant. For example, a material of the first conductive semiconductor layer 124 may be selected from among GaN, AlGaN, InGaN, InAlGaN, and the like which are semiconductor materials having a composition formula of $In_{x1}Al_{y1}Ga_{1-x1-y1}N$ ($0 \leq x1 \leq 1$, $0 \leq y1 \leq 1$, and $0 \leq x1+y1 \leq 1$). Further, the first dopant may be an n-type dopant such as Si, Ge, Sn, Se, or Te. When the first dopant is an n-type dopant, the first conductive semiconductor layer 124 doped with the first dopant may be an n-type semiconductor layer.

The first conductive semiconductor layer 124 may include a 1-1 (first-first) conductive semiconductor layer (a first sublayer) 124a, a 1-2 (first-second) conductive semiconductor layer (a third sublayer) 124c, and an intermediate layer (a second layer) 124b disposed between the 1-1 conductive semiconductor layer 124a and the 1-2 conductive semiconductor layer 124c.

The 1-2 conductive semiconductor layer 124c may be disposed closer to the active layer 126 than the 1-1 conductive semiconductor layer 124a. An Al composition of the 1-2 conductive semiconductor layer 124c may be lower than that of the 1-1 conductive semiconductor layer 124a. The Al composition of the 1-2 conductive semiconductor layer 124c may be in a range of 40% to 70%, and the Al composition of the 1-1 conductive semiconductor layer 124a may be in a range of 50% to 80%.

A thickness of the 1-2 conductive semiconductor layer 124c may be thinner than that of the 1-1 conductive semiconductor layer 124a. The thickness of the 1-1 conductive semiconductor layer 124a may be 130% or more with respect to the thickness of the 1-2 conductive semiconductor layer 124c. According to this structure, since the intermediate layer 124b is formed after the 1-1 conductive semiconductor layer 124a having a high Al composition is sufficiently grown, overall crystallizability of the light emitting structure 120 can be improved.

An Al composition of the intermediate layer 124b may be lower than that of the first conductive semiconductor layer 124. The intermediate layer 124b may absorb a laser irradiated toward the light emitting structure 120 during a laser lift-off (LLO) process to serve to prevent damage to the active layer 126. Accordingly, in the semiconductor device according to the present embodiment, damage to the active layer can be reduced, and thus light output and electrical characteristics thereof can be enhanced.

The thickness and the Al composition of the intermediate layer 124b may be appropriately adjusted to absorb the laser irradiated toward the light emitting structure 120 during the LLO process. For example, the Al composition of the intermediate layer 124b may be in a range of 30% to 60%, and the thickness thereof may be in a range of 1 nm to 10 nm. For example, the intermediate layer 124b may be AlGaN, but is not limited thereto.

The intermediate layer 124b may be disposed between the first conductive semiconductor layer 124 and the active layer 126. Alternatively, the intermediate layer 124b may include a first intermediate layer (not shown) having an Al composition that is lower than that of the first conductive semiconductor layer 124, and a second intermediate layer (not shown) having an Al composition that is higher than that of the first conductive semiconductor layer 124. A plurality of first intermediate layers and a plurality of second intermediate layers may be alternately arranged.

The active layer 126 may be disposed between the first conductive semiconductor layer 124 and the second conductive semiconductor layer 127. The active layer 126 is a layer in which electrons (or holes) injected through the first conductive semiconductor layer 124 and holes (or electrons) injected through the second conductive semiconductor layer 127 are recombined. The active layer 126 may generate light having a UV wavelength that transition to being in a low energy level by the recombination of electrons and holes.

The active layer 126 may have any one of a single well structure, a multi-well structure, a single quantum well structure, a multi quantum well (MQW) structure, a quantum dot structure, or a quantum wire structure, but the active layer 126 is not limited thereto.

The second conductive semiconductor layer 127 may be formed on the active layer 126, may be formed of a Group III-V or II-VI compound semiconductor, and may be doped with a second dopant. The second conductive semiconductor layer 127 may be formed of a semiconductor material having a composition formula of $In_{x5}Al_{y2}Ga_{1-x5-y2}N$ ($0 \leq x5 \leq 1$, $0 \leq y2 \leq 1$, and $0 \leq x5+y2 \leq 1$), or a material selected from among AlInN, AlGaAs, GaP, GaAs, GaAsP, and AlGaInP. When the second dopant is a p-type dopant such as Mg, Zn, Ca, Sr, or Ba, the second conductive semiconductor layer 127 doped with the second dopant may be a p-type semiconductor layer.

The second conductive semiconductor layer 127 may include 2-1, 2-2, and 2-3 conductive semiconductor layers (a first, a second and a third layers) 127a, 127b, and 127c. The 2-1 conductive semiconductor layer (the first sublayer) 127a may have an Al composition that is lower than that of the 2-2 conductive semiconductor layer 127b.

An electron blocking layer 129 may be disposed between the active layer 126 and the second conductive semiconductor layer 127. The electron blocking layer 129 may block a flow of first carriers (e.g., electrons) which are supplied from the first conductive semiconductor layer 124 and are discharged to the second conductive semiconductor layer 127, thereby increasing the probability of the electrons recombining with holes in the active layer 126. An energy band gap of the electron blocking layer 129 may be greater than that of the active layer 126 and/or the second conductive semiconductor layer 127.

For example, a material of the electron blocking layer 129 may be selected from among AlGaN, InGaN, InAlGaN, and the like which are semiconductor materials having a composition formula of $In_{x1}Al_{y1}Ga_{1-x1-y1}N$ ($0 \le x1 \le 1$, $0 \le y1 \le 1$, and $0 \le x1+y1 \le 1$).

Referring to FIG. 2, all of the first conductive semiconductor layer 124, the active layer 126, the second conductive semiconductor layer 127, and the electron blocking layer 129 may include Al. Accordingly, the first conductive semiconductor layer 124, the active layer 126, the second conductive semiconductor layer 127, and the electron blocking layer 129 may have an AlGaN composition.

The Al composition of the electron blocking layer 129 may be in a range of 50% to 100%. When the Al composition of the electron blocking layer 129 is less than 50%, there are problems in that a height of an energy barrier for blocking electrons may be insufficient and light emitted from the active layer 126 may be absorbed by the electron blocking layer 129.

The electron blocking layer 129 may include a 1-1 section 129a and a 1-2 section 129c. The electron blocking layer 129 may include the second dopant. The second dopant may include a p-type dopant such as Mg, Zn, Ca, Sr, and Ba. When the second dopant is included in the electron blocking layer 129, the electron blocking layer 129 may include the same dopant as the second conductive semiconductor layer. However, the present disclosure is not limited thereto, and the electron blocking layer 129 may have the same polarity as that of the second conductive semiconductor layer 127 and may include a second dopant different from that included in the second conductive semiconductor layer.

According to the present embodiment, injection efficiency of second carriers (e.g., holes) is increased by the 1-1 section 129a and the 1-2 section 129c and resistance is lowered such that an operating voltage Vf may be improved.

An Al composition of the 1-1 section 129a may be increased near the second conductive semiconductor layer 127. The Al composition of the 1-1 section 129a may be in a range of 80% to 100%. That is, the 1-1 section 129a may be AlGaN or AlN. Alternatively, the 1-1 section 129a may be a superlattice layer in which AlGaN and AlN are alternately arranged.

A thickness of the 1-1 section 129a may be in a range of about 0.1 nm to 4 nm. When the thickness of the 1-1 section 129a is thinner than 0.1 nm, there is a problem in that movement of the first carriers (e.g., electrons) may not be efficiently blocked. Also, when the thickness of the 1-1 section 129a is thicker than 4 nm, injection efficiency of the second carriers (e.g., holes) into the active layer may be degraded.

An undoped section 129b not doped with the second dopant may be disposed between the 1-1 section 129a and the 1-2 section 129c. The undoped section 129b may serve to prevent diffusion of the dopant from the second conductive semiconductor layer 127 to the active layer 126.

The second conductive semiconductor layer 127 may include the 2-1, 2-2, and 2-3 conductive semiconductor layers 127a, 127b, and 127c.

A thickness of the 2-2 conductive semiconductor layer 127b may be greater than 10 nm and less than 50 nm. For example, the thickness of the 2-2 conductive semiconductor layer 127b may be 25 nm. When the thickness of the 2-2 conductive semiconductor layer 127b is less than 10 nm, resistance may increase in a horizontal direction such that current injection efficiency may be degraded. Further, when the thickness of the 2-2 conductive semiconductor layer 127b is greater than 50 nm, resistance increases in a vertical direction such that the current injection efficiency may be degraded.

An Al composition of the 2-2 conductive semiconductor layer 127b may be higher than that of a well layer 126a. In order to generate UV light, the Al composition of the well layer 126a may be in a range of about 30% to 70%. When the Al composition of the 2-2 conductive semiconductor layer 127b is lower than that of the well layer 126a, since the 2-2 conductive semiconductor layer 127b absorbs light, light extraction efficiency may be degraded. However, the present disclosure is not limited thereto. For example, an Al composition in some sections of the 2-2 conductive semiconductor layer 127b may be lower than that of the well layer 126a.

The Al composition of the 2-2 conductive semiconductor layer 127b may be greater than 40% and less than 80%. When the Al composition of the 2-2 conductive semiconductor layer 127b is less than 40%, there is a problem in that a light absorption rate is increased, and, when the Al composition thereof is greater than 80%, the current injection efficiency may be deteriorated. For example, when the Al composition of the well layer 126a is 30%, the Al composition of the 2-2 conductive semiconductor layer 127b may be 40%.

An Al composition of the 2-1 conductive semiconductor layer 127a may be lower than that of the well layer 126a. When the Al composition of the 2-1 conductive semiconductor layer 127a is higher than that of the well layer 126a, resistance between the 2-1 conductive semiconductor layer 127a and second electrodes is increased such that sufficient ohmic contact is not achieved and the current injection efficiency is lowered.

The Al composition of the 2-1 conductive semiconductor layer 127a may be greater than 1% and less than 50%. When the Al composition of the 2-1 conductive semiconductor layer 127a is greater than 50%, sufficient ohmic contact is not achieved between the 2-1 conductive semiconductor layer 127a and the second electrode, and, when the Al composition thereof is less than 1%, the Al composition thereof is substantially the same as a GaN composition to absorb light.

A thickness of the 2-1 conductive semiconductor layer 127a may be in a range of 1 nm to 30 nm or a range of 1 nm to 10 nm. As described above, since the Al composition of the 2-1 conductive semiconductor layer 127a is low for ohmic contact, the 2-1 conductive semiconductor layer 127a may absorb UV light. Consequently, controlling the thickness of the 2-1 conductive semiconductor layer 127a to be as thin as possible is advantageous from the viewpoint of light output.

However, when the thickness of the 2-1 conductive semiconductor layer 127a is controlled to be 1 nm or less, the Al composition may be abruptly varied such that crystallizability may be degraded. Further, when the thickness of the 2-1 conductive semiconductor layer 127a is too thin, sheet resistance may increase, and an electrical characteristic of the semiconductor device may be degraded. In addition, when the thickness thereof is greater than 30 nm, an amount of light absorbed by the 2-1 conductive semiconductor layer 127a is too large and the light output efficiency may be reduced.

The thickness of the 2-1 conductive semiconductor layer 127a may be smaller than that of the 2-2 conductive semiconductor layer 127b. A thickness ratio of the 2-2 conductive semiconductor layer 127b to the 2-1 conductive semiconductor layer 127a may be in a range of 1.5:1 to 20:1. When the thickness ratio is less than 1.5:1, the thickness of the 2-2 conductive semiconductor layer 127b is too thin and the current injection efficiency may be reduced. Further, when the thickness ratio is greater than 20:1, the thickness of the 2-1 conductive semiconductor layer 127a is too thin and ohmic contact reliability may be degraded.

The Al composition of the 2-2 conductive semiconductor layer 127b may decrease away from the active layer 126. In addition, the Al composition of the 2-1 conductive semiconductor layer 127a may decrease away from the active layer 126.

At this point, the decrease of the Al composition of the 2-1 conductive semiconductor layer 127a may be greater than that of the Al composition of the 2-2 conductive semiconductor layer 127b. That is, a variation of the Al composition of the 2-1 conductive semiconductor layer 127a in a thickness direction thereof may be greater than that of the Al composition of the 2-2 conductive semiconductor layer 127b in a thickness direction thereof.

Since the thickness of the 2-2 conductive semiconductor layer 127b should be greater than that of the 2-1 conductive semiconductor layer 127a while the Al composition of the 2-2 conductive semiconductor layer 127b should be higher than that of the well layer 126a, the decrease of the Al composition thereof may be relatively slow. However, since the thickness of the 2-1 conductive semiconductor layer 127a is as described above and the variation of the Al composition thereof is large, the decrease of the Al composition thereof may be relatively large.

The 2-3 conductive semiconductor layer 127c may have a uniform Al composition. A thickness of the 2-3 conductive semiconductor layer 127c may be in a range of 20 nm to 60 nm. The Al composition of the 2-3 conductive semiconductor layer 127c may be in a range of 40% to 70%.

As described above, the thickness of the 2-1 conductive semiconductor layer 127a may be in the range of 1 nm to 10 nm, the thickness of the 2-2 conductive semiconductor layer 127b may be in the range of 10 nm to 50 nm, and the thickness of the 2-3 conductive semiconductor layer 127c may be in the range of 20 nm to 60 nm.

Accordingly, a ratio of the thickness of the 2-1 conductive semiconductor layer 127a to an overall thickness of the second conductive semiconductor layer 127 may be in a range of 1:3 to 1:120. However, the present disclosure is not limited thereto, and the ratio of the thickness of the 2-1 conductive semiconductor layer 127a to the overall thickness of the second conductive semiconductor layer 127 may be in a range of 1:3 to 1:50 or a range of 1:3 to 1:70.

Figure 3:
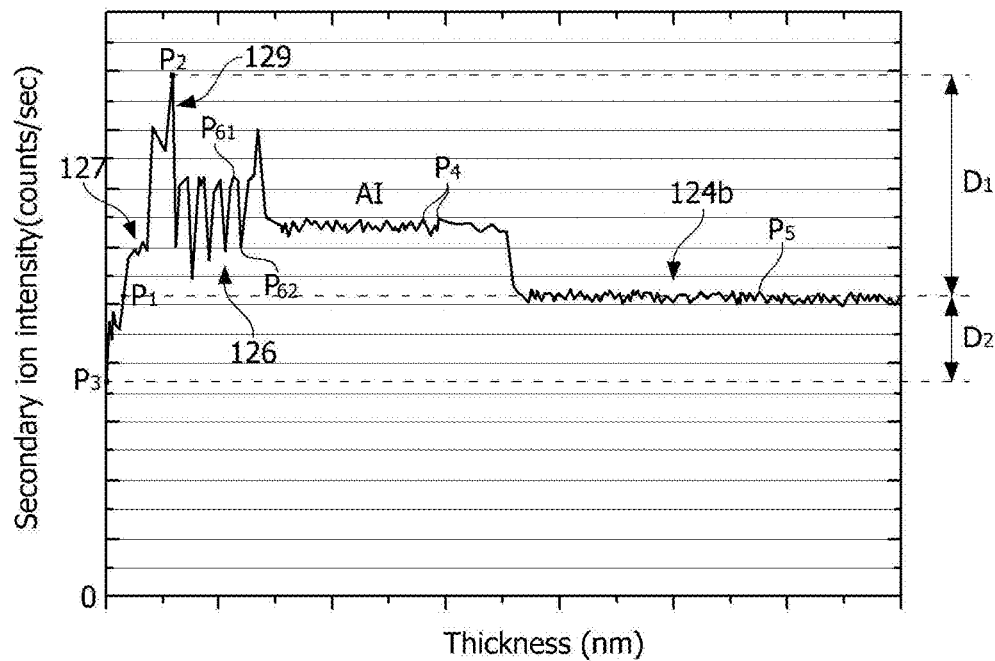
FIG. 3 is a secondary ion mass spectroscopy (SIMS) graph illustrating a variation of Al ion intensity of the light emitting structure according to one embodiment of the present disclosure.
Figure 4:
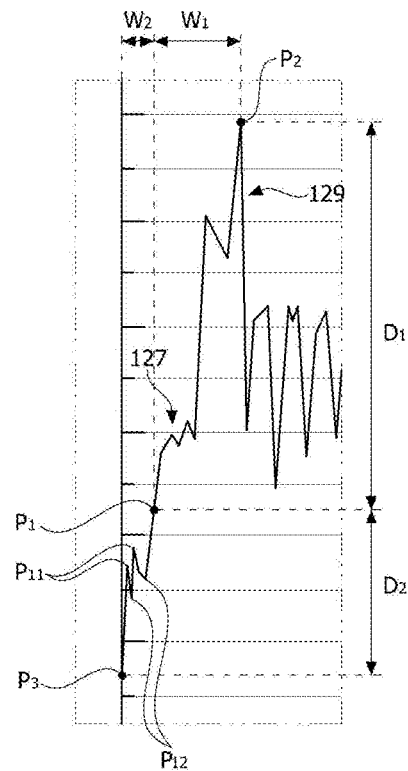
FIG. 4 is an enlarged diagram of a portion of FIG. 3.

FIG. 3 is a secondary ion mass spectroscopy (SIMS) graph illustrating a variation of Al ion intensity of the light emitting structure according to one embodiment of the present disclosure, and FIG. 4 is an enlarged diagram of a portion of FIG. 3.

SIMS data may be analytical data obtained by a time-of-flight secondary ion mass spectrometry (TOF-SIMS).

The SIMS data may be obtained by irradiating a surface of a target with primary ions and counting and analyzing the number of secondary ions released from the surface. The primary ions may be selected from among $O^{2+}$, $Cs^+$, $Bi^+$, and the like. For example, an acceleration voltage may be in a range of 20 keV to 30 keV, an irradiated current may be in a range of 0.1 pA to 5.0 pA, and an implant area may be 20 nm×20 nm, but the present disclosure is not limited thereto.

The SIMS data may be obtained by collecting a secondary ion mass spectrum through etching that is gradually performed on a surface of the second conductive semiconductor layer (i.e., a position at which a depth is zero) in a direction of the first conductive semiconductor layer.

However, the present disclosure is not limited thereto, and various measurement conditions for detecting an AlGaN-based and/or GaN-based semiconductor material, and first and second dopant materials may be used.

Referring to FIGS. 3 and 4, in the light emitting structure, intensity of Al ions (i.e., secondary ions) may vary from the first conductive semiconductor layer 124 toward the second conductive semiconductor layer 127. The second conductive semiconductor layer 127 may include a P-type semiconductor layer and a blocking layer.

The light emitting structure may include a first intermediate intensity P1 having the lowest Al intensity in the first conductive semiconductor layer 124, a first maximum intensity P2 having the highest Al intensity in the light emitting structure, and a first minimum intensity P3 having the lowest Al intensity in the light emitting structure.

The second semiconductor layer 127 includes a first minimum intensity P3 of the secondary ions and a first maximum intensity P2 of the secondary ions. The first semiconductor layer 124 includes a second minimum intensity P5 of the secondary ions and a second maximum intensity P4 of the secondary ions. The second minimum intensity P5 is different from the first minimum intensity P3.

The first intermediate intensity P1 may have the same ion intensity as the intermediate layer 124b disposed in the first conductive semiconductor layer 124. The first maximum intensity P2 may be the 1-1 section 129a of the electron blocking layer 129. Further, the first minimum intensity P3 may be a surface layer (i.e., the 2-1 conductive semiconductor layer) at which the second conductive semiconductor layer comes into direct contact with the second electrode (i.e., a P ohmic electrode). The result of the SIMS analysis may be interpreted as a spectrum with respect to secondary ion intensity of a material or a doping concentration thereof, and, when the secondary ion intensity or the doping concentration is analyzed, noise occurring within a range of 0.9 to 1.1 times the intensity or doping concentration may be included in the result. Thus, the description "being equal to/being the same as" may refer to noise 0.9 times or more and 1.1 times or less specific secondary ion intensity or doping concentration being included in the result. At this point, the first intermediate intensity P1 may have the same ion intensity as the highest point of the secondary ion intensity of the intermediate layer 124b.

The second semiconductor layer includes two intensity peaks P11 and an intensity valley P12 between the first minimum intensity P3 and the first intermediate intensity P1. The intensity at the two intensity peaks P11 is higher than the intensity at the intensity valley P12.

The intensity exhibited in the active layer 126 is lower than the first and second maximum intensities P2 and P4 and are higher than the first and second minimum intensities P3 and P5. The intensity exhibited in the active layer 126 includes a plurality of peaks P61 and a plurality of valleys P62. The intensity exhibited in the peaks P61 of the active layer 126 is greater than the intensity exhibited in the valleys P62 of the active layer 126.

The measurement of the intensity may be performed by a measurement method such as transmission electron microscope (TEM), X-ray diffraction spectroscopy (XRD), or the like in addition to the method using SIMS spectroscopy.

A ratio D1:D2 of a first Al intensity difference D1 between the first intermediate intensity P1 and the first maximum intensity P2 to a second Al intensity difference D2 between the first intermediate intensity P1 and the first minimum intensity P3 may be in a range of 1:0.2 to 1:2 or a range of 1:0.2 to 1:1. When the ratio D1:D2 is less than 1:0.2, the second Al intensity difference D2 is relatively small and there is a problem in that the Al intensity may not be sufficiently lowered. Consequently, contact resistance with the second electrode may increase. Further, when the ratio D1:D2 is greater than 1:2, the second Al intensity difference D2 is relatively large and there is a problem in that the Al strength is abruptly varied and crystallizability is degraded.

Conventionally, a thin GaN layer is inserted between an electrode and a second conductive semiconductor layer for ohmic contact therebetween. However, in this case, since the GaN layer does not contain Al, the second Al intensity difference D2 may be abruptly increased. Consequently, the ratio D1:D2 of the first Al intensity difference D1 to the second Al intensity difference D2 become out of the range of 1:0.2 to 1:2.

Referring to FIG. 4, a ratio W1:W2 of a first thickness W1 to a second thickness W2 may be in a range of 1:0.2 to 1:1 based on the SIMS data. The first thickness W1 may be a thickness of the light emitting structure between the first intermediate intensity P1 and the first maximum intensity P2, and the second thickness W2 may be a thickness of the light emitting structure between the first intermediate intensity P1 and the first minimum intensity P3.

When the ratio W1:W2 of the first thickness W1 to the second thickness W2 is less than 1:0.2, the second thickness W2 is relatively small and the variation of the Al intensity in the second conductive semiconductor layer 127 may be abruptly varied. Consequently, the crystallizability may be degraded.

Further, when the ratio W1:W2 is greater than 1:1, the second thickness W2 is relatively large and there is a problem in that light extraction efficiency is decreased.

Figure 5:
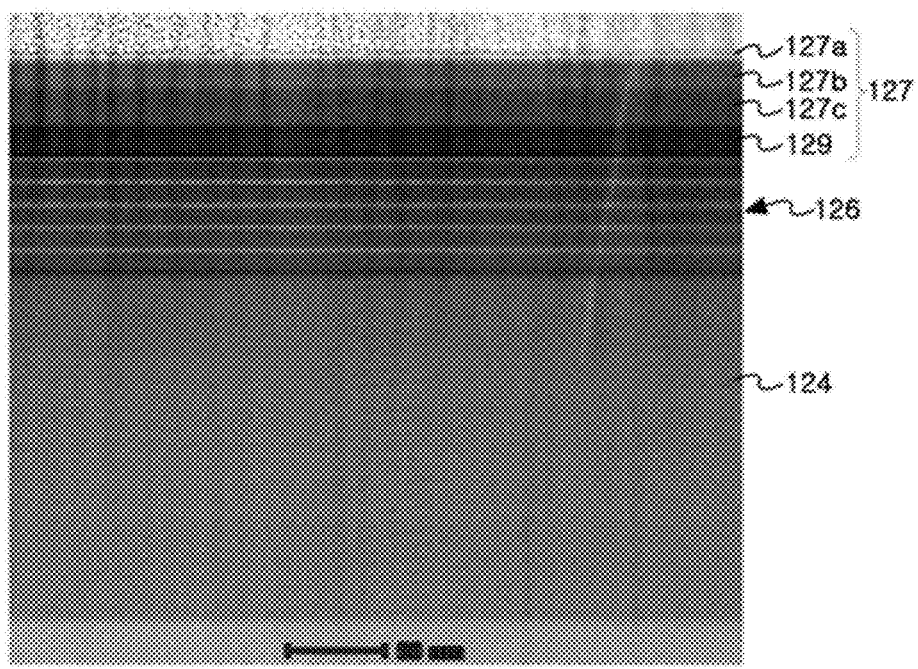
FIG. 5 is a photograph of the light emitting structure according to one embodiment of the present disclosure.
Figure 6:
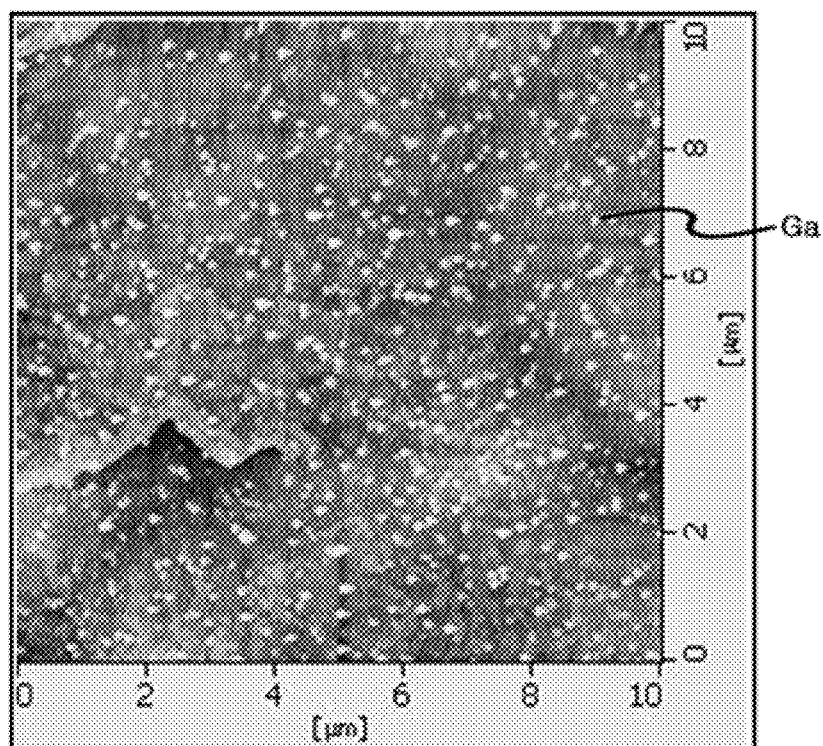
FIG. 6 shows atomic force microscope (AFM) data obtained by measuring a surface of a second conductive semiconductor layer according to one embodiment of the present disclosure.

FIG. 5 is a photograph of the light emitting structure according to one embodiment of the present disclosure, and FIG. 6 shows atomic force microscope (AFM) data obtained by measuring a surface of a second conductive semiconductor layer according to one embodiment of the present disclosure.

Referring to FIG. 5, the light emitting structure may be configured such that the first conductive semiconductor layer 124, the active layer 126, the electron blocking layer 129, and the second conductive semiconductor layer 127 may be sequentially stacked. The second electrode may come into direct contact with the surface 127a of the second conductive semiconductor layer 127 to form an ohmic contact therebetween.

Referring to FIG. 6, it can be seen that a cluster is observed on a surface layer of the second conductive semiconductor layer 127. According to the embodiment, since the Al composition of the 2-1 conduction type semiconductor layer, which is the surface layer, is in a range of 1% to 10%, materials such as AlN, AlGaN, and GaN are generated in a cluster form such that a junction area may be increased. Consequently, an electrical characteristic can be improved.

Figure 7:
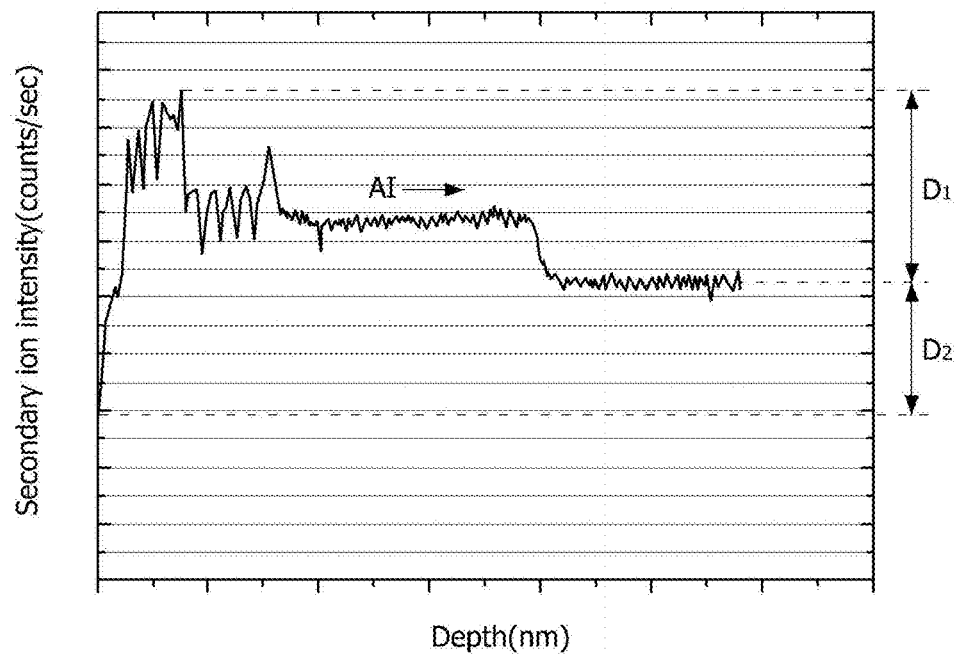
FIG. 7 is a SIMS graph illustrating variation of Al ion intensity of a light emitting structure according to another embodiment of the present disclosure.

FIG. 7 is a SIMS graph illustrating a variation of AL ion intensity of a light emitting structure according to another embodiment of the present disclosure.

Referring to FIG. 7, the ratio D1:D2 of the first Al intensity difference D1 between the first intermediate intensity P1 and the first maximum intensity P2 to the second Al intensity difference D2 between the first intermediate intensity P1 and the first minimum intensity P3 was measured to be 1:0.72. Accordingly, it may be determined that the ratio D1:D2 satisfied the range of 1:0.2 to 1:2. The first Al intensity difference D1 was measured to be 6.8, and the second Al intensity difference D2 was measured to be 4.9.

Figure 8:
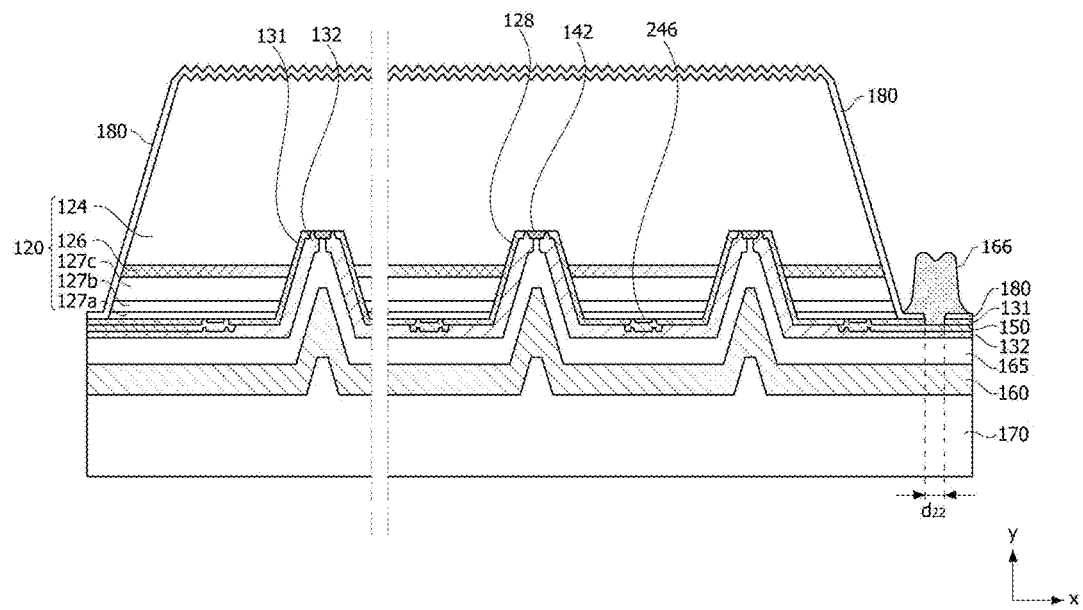
FIG. 8 is a conceptual diagram of a semiconductor device according to one embodiment of the present disclosure.
Figure 9A:
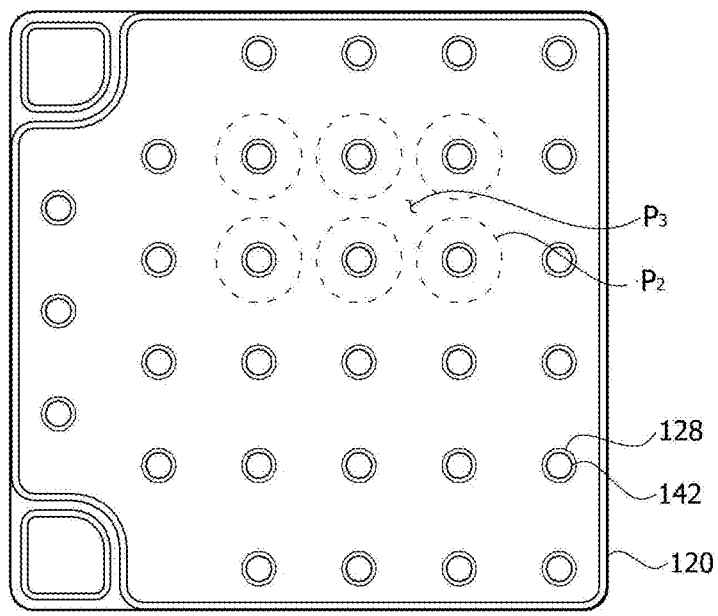
FIGS. 9A and 9B are plan views of a semiconductor device according to an embodiment of the present disclosure.
Figure 9B:
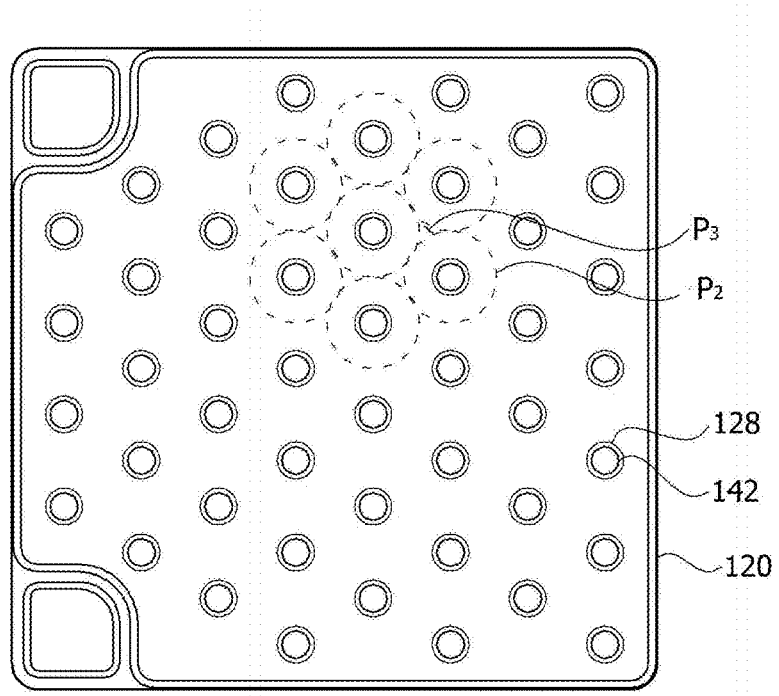

FIG. 8 is a conceptual diagram of a semiconductor device according to one embodiment of the present disclosure, and FIGS. 9A and 9B are plan views of a semiconductor device according to an embodiment of the present disclosure.

Referring to FIG. 8, the above-described structure of the light emitting structure 120 may be directly applied to the present embodiment. A first electrode 142 may be disposed on an upper surface of a recess 128 to be electrically connected to the first conductive semiconductor layer 124. A second electrode 246 may be formed below the second conductive semiconductor layer 127.

The second electrode 246 may come into contact with the 2-2 conductive semiconductor layer 127b to be electrically connected thereto.

Since the Al composition of the 2-1 conductive semiconductor layer 127a in contact with the second electrode 246 is in a range of 1% to 10%, an ohmic connection may be easily established between the 2-1 conductive semiconductor layer 127a and the second electrode 246. Further, since the thickness of the 2-1 conductive semiconductor layer 127a is greater than 1 nm and less than 30 nm, an amount of light absorption may be small.

The first electrode 142 and the second electrode 246 may be ohmic electrodes. The first electrode 142 and the second electrode 246 may be formed of materials including at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf, but the present disclosure is not limited to these materials.

A second electrode pad 166 may be disposed at an edge of one side of the semiconductor device. A central portion of the second electrode pad 166 is recessed so that an upper surface of the second electrode pad 166 may have a concave portion and a convex portion. A wire (not shown) may be bonded to the concave portion of the upper surface. Thus, a bonding area may be widened so that the second electrode pad 166 and the wire may be more firmly bonded.

The second electrode pad 166 may serve to reflect light so that light extraction efficiency can be improved as the second electrode pad 166 nears the light emitting structure 120.

A height of the convex portion of the second electrode pad 166 may be higher than that of the active layer 126. Accordingly, the second electrode pad 166 may reflect light, which is emitted from the active layer 126 in a horizontal direction of the device, upward, thereby improving the light extraction efficiency and controlling a pointing angle.

A first insulating layer 131 may be partially open below the second electrode pad 166 so that a second conductive layer 150 and the second electrode 246 are electrically connected. A passivation layer 180 may be formed on an upper surface and a side surface of the light emitting structure 120. The passivation layer 180 may come into contact with a region adjacent to the second electrode 246 and the first insulating layer 131 below the second electrode 246.

For example, a width d22 of a portion at which the second electrode 246 comes into contact with the second conductive layer 150 by the first insulating layer 131 being opened may be in a range of 40 µm to 90 µm. When the width d22 is less than 40 µm, there is a problem in that an operating voltage may increase, and, when the width d22 is greater than 90 µm, it may be difficult to secure a process margin for not exposing the second conductive layer 150 to the outside. When the second conductive layer 150 is exposed to an outer region of the second electrode 246, reliability of the light emitting device may be degraded. Accordingly, the width d22 may preferably be in a range of 60% to 95% with respect to an overall width of the second electrode pad 166.

The first insulating layer 131 may electrically isolate the first electrode 142 from the active layer 126 and the second conductive semiconductor layer 127. Further, the first insulating layer 131 may electrically isolate the second electrode 246 and the second conductive layer 150 from the first conductive layer 165.

The first insulating layer 131 may be formed of at least one material selected from the group consisting of $SiO_2$, $Si_xO_y$, $Si_3N_4$, $Si_xN_y$, $SiO_xN_y$, $Al_2O_3$, $TiO_2$, AlN, and the like, but is not limited thereto. The first insulating layer 131 may be formed with a single layer or a multilayer. For example, the first insulating layer 131 may be a distributed Bragg reflector (DBR) having a multilayered structure including an AlSi oxide or a Ti compound. However, the present disclosure is not limited thereto, and the first insulating layer 131 may include various reflective structures.

When the first insulating layer 131 performs an isolation function, light emitted from a side surface of the active layer 126 may be reflected upward to improve the light extraction efficiency. As will be described below, in a UV semiconductor device, as the number of recesses 128 increases, the light extraction efficiency may be more effective.

The second conductive layer 150 may cover the second electrode 246. Thus, the second electrode pad 166, the second conductive layer 150, and the second electrode 246 may form one electrical channel.

The second conductive layer 150 may completely surround the second electrode 246 to be in contact with a side surface and an upper surface of the first insulating layer 131. The second conductive layer 150 may be made of a material having good adhesive strength with the first insulating layer 131, at least one material selected from the group consisting of Cr, Al, Ti, Ni, Au, and the like, and an alloy thereof, and with a single layer or a plurality of layers.

When the second conductive layer 150 is in contact with the side surface and the upper surface of the first insulating layer 131, thermal and electrical reliability of the second electrode 246 can be improved. Further, the second conductive layer 150 may have a reflection function for reflecting light, which is emitted between the first insulating layer 131 and the second electrode 246, upward.

The second conductive layer 150 may also be disposed at a region between the first insulating layer 131 and the second electrode 246 and to which the second conductive semiconductor layer is exposed at a second spacing distance. The second conductive layer 150 may come into contact with a side surface and an upper surface of the second electrode 246 and the side surface and the upper surface of the first insulating layer 131 at the second spacing distance.

Further, the second conductive layer 150 and the second conductive semiconductor layer 127 may be in contact with each other within the second spacing distance to be disposed at a region at which a Schottky junction is formed, and the Schottky junction may be formed to facilitate current diffusion.

The second insulating layer 132 electrically insulates the second electrode 246 and the second conductive layer 150 from the first conductive layer 165. The first conductive layer 165 may pass through the second insulating layer 132 to be electrically connected to the first electrode 142.

The first conductive layer 165 and a bonding layer 160 may be disposed along a bottom surface of the light emitting structure 120 and a shape of the recess 128. The first conductive layer 165 may be made of a material having superior reflectance. For example, the first conductive layer 165 may include Al. When the first conductive layer 165 includes Al, the first conductive layer 165 serves to reflect the light, which is emitted from the active layer 126, upward so that the light extraction efficiency can be improved.

The bonding layer 160 may include a conductive material. For example, the bonding layer 160 may include a material selected from the group consisting of gold, tin, indium, Al, silicon, silver, nickel, and copper, or an alloy thereof.

A substrate 170 may be made of a conductive material. For example, the substrate 170 may include a metal or a semiconductor material. The substrate 170 may be a metal having superior electrical conductivity and/or superior thermal conductivity. In this case, heat generated while the semiconductor device operates may be quickly discharged to the outside.

The substrate 170 may include a material selected from the group consisting of silicon, molybdenum, tungsten, copper, and Al, or an alloy thereof.

Irregularities may be formed on the upper surface of the light emitting structure 120. The irregularities can improve extraction efficiency of the light emitted from the light emitting structure 120. The irregularities may have different average heights according to a UV wavelength, and, in the case of UV-C, when a height of each of the irregularities is in a range of about 300 nm to 800 nm and an average height thereof is in a range of 500 nm to 600 nm, the light extraction efficiency can be improved.

FIGS. 9A and 9B are plan views of a semiconductor device according to an embodiment of the present disclosure.

When the Al composition of the light emitting structure 120 increases, a current distribution characteristic inside the light emitting structure 120 may be degraded. Further, the active layer 126 increases an amount of light emitted from the side surface thereof (i.e., a TM mode) in comparison to a GaN-based blue light emitting device. The TM mode may be generated in the UV semiconductor device.

According to the present embodiment, for current diffusion, the first electrodes 142 may be disposed with the number of recesses 128 formed in a GaN semiconductor emitting light having a wavelength in a UV region relatively larger than a GaN semiconductor emitting blue light.

Referring to FIG. 9A, when the Al composition is increased, the current distribution characteristic may be deteriorated. Accordingly, a current is distributed to only a position adjacent to each of the first electrodes 142 such that a current density may be drastically lowered at a position away from each of the first electrodes 142. Therefore, an effective light emission region P2 may narrow. The effective light emission region P2 may be defined as a region from a boundary point at which a current density is 40% or less based on the current density to the position adjacent to the first electrode 142 having the highest current density. For example, the effective light emission region P2 may be adjusted according to a level of an injected current and an Al composition in a range of 5 μm to 40 μm from a center of each of the recesses 128.

Specifically, a low current density region P3 between adjacent first electrodes 142 has a low current density, and thus hardly contributes to light emission. Therefore, in the present embodiment, the first electrodes 142 are disposed in the low current density region P3 having the low current density such that light output can be improved.

Generally, since a GaN semiconductor layer has a relatively superior current distribution characteristic, it may be preferable for areas of the recesses 128 and the first electrodes 142 to be minimized. This is because, an area of the active layer 126 decreases as the areas of the recesses 128 and the first electrodes 142 increases. However, in the embodiment, since the current distribution characteristic is relatively low due to a high Al composition, it may be preferable for the low current density region P3 to be reduced by increasing the number of the first electrodes 142 even though the area of the active layer 126 is sacrificed.

Referring to FIG. 9B, when the number of the recesses 128 is 48, the recesses 128 may be disposed in a zigzag form instead of being horizontally vertically disposed in a straight line. In this case, the area of the low current density region P3 is narrower, and thus most active layers may participate in the light emission. When the number of the recesses 128 is in a range of 82 to 110, the current may be more efficiently distributed such that the operating voltage can be further lowered, and the light output can be improved. In a semiconductor device emitting UV-C light, when the number of recesses 128 is less than 70, electrical and optical characteristics may be degraded, and, when the number of recesses 128 is greater than 110, the electrical characteristic can be improved while a volume of the light emitting layer is reduced such that the optical characteristic may be degraded.

A first area at which the plurality of first electrodes 142 are in contact with the first conductive semiconductor layer 124 may be in a range of 7.4% to 20% or a range of 10% to 20% with respect to a maximum cross-sectional area of the light emitting structure 120 in a horizontal direction. The first area may be the sum of areas at which the plurality of first electrodes 142 are in contact with the first conductive semiconductor layer 124.

When the first area of the plurality of first electrodes 142 is less than 7.4%, light output may be decreased due to an insufficient current distribution characteristic, and, when the first area thereof exceeds 20%, areas of the active layer and the second electrode excessively decrease such that there is a problem in that the operating voltage is raised and the light output is decreased.

Further, an overall area of the plurality of recesses 128 may be in a range of 13% to 30% with respect to the maximum cross-sectional area of the light emitting structure 120 in the horizontal direction. When the overall area of the plurality of recesses 128 does not satisfy the above-described condition, it is difficult to control the overall area of the first electrodes 142 to be in the range of 7.4% to 20%. In addition, there is a problem in that the operating voltage is raised and the light output is decreased.

A second area at which the second electrodes 246 are in contact with the second conductive semiconductor layer 127 may be in a range of 35% to 70% with respect to the maximum cross-sectional area of the light emitting structure 120 in the horizontal direction. The second area may be an overall area at which the second electrodes 246 are in contact with the second conductive semiconductor layer 127.

When the second area is less than 35%, the area of the second electrode 246 is excessively small such that there is a problem in that the operating voltage is raised and injection efficiency of the second carriers (e.g., holes) is reduced. When the second area exceeds 70%, the first area may not be effectively wide such that there is a problem in that injection efficiency of the first carriers (e.g., electrons) is reduced.

The first area and the second area have an inverse relationship. That is, when the number of recesses is increased to increase the number of first electrodes, the area of the second electrode decreases. To increase the light output, a diffusion characteristic of electrons and holes should be balanced. Therefore, it is important to determine a proper ratio of the first area and the second area.

A ratio (i.e., the first area: the second area) of the first area at which the plurality of first electrodes are in contact with the first conductive semiconductor layer to the second area at which the second electrodes are in contact with the second conductive semiconductor layer may be in a range of 1:3 to 1:10.

When the area ratio is greater than 1:10, the first area is relatively small such that the current distribution characteristic may be deteriorated. Further, when the area ratio is less than 1:3, there is a problem in that the second area is relatively small.

Figure 10:
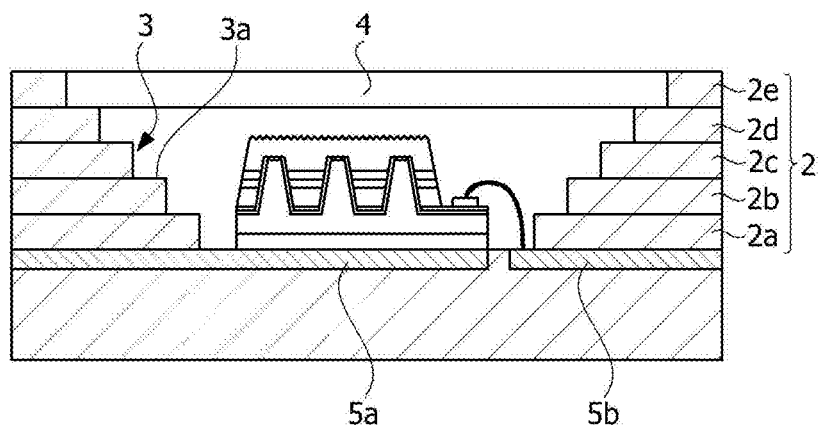
FIG. 10 is a conceptual diagram of a light emitting device package according to one embodiment of the present disclosure.

FIG. 10 is a conceptual diagram of a light emitting device package according to one embodiment of the present disclosure.

The semiconductor device is configured as a package and may be used for a device for hardening a resin, a resist, a spin-on dielectric (SOD), or spin-on glass (SOG). Alternatively, the semiconductor device package may be used for a therapeutic medical application or an electronic device such as a sterilizing device for an air purifier or a water purifier.

Referring to FIG. 10, the semiconductor device package may include a body 2 at which a recess 3 is formed, a semiconductor device 1 disposed on the body 2, and a pair of lead frames 5a and 5b disposed on the body 2 and electrically connected to the semiconductor device 1. The semiconductor device 1 may include all of the above-described configurations.

The body 2 may include a material or a coating layer which reflects UV light. The body 2 may be formed by stacking a plurality of layers 2a, 2b, 2c, and 2d. The plurality of layers 2a, 2b, 2c, and 2d may be the same material or may include different materials.

The recess 3 may be formed to be wide away from the semiconductor device, and a step 3a may be formed on an inclined surface of the recess 3.

A light transmission layer 4 may cover the recess 3. The light transmission layer 4 may be made of a glass material, but is not limited thereto. The light transmission layer 4 may include any material which is capable of effectively transmitting UV light. An interior of the recess 3 may be an empty space.

The semiconductor device may be used as a light source of a lighting system, an image display device, or a lighting device. That is, the semiconductor device may be applied to various electronic devices which are disposed in a case to provide light. For example, when the semiconductor device and an RGB fluorescent material are mixed and used, white light with a superior color rendering index (CRI) may be realized.

The above-described semiconductor device may be configured in the form of, e.g., a light emitting device package to be used as a light source of a lighting system, an image display device, a lighting device, and the like.

When the semiconductor device is used as a backlight unit of an image display device, the semiconductor device may be used as an edge type backlight unit or a direct-type backlight unit, and, when the semiconductor device is used as a light source of a lighting device, the semiconductor device may be used as lighting equipment or bulb type equipment, and also may be used as a light source of a mobile terminal.

The light emitting device includes a laser diode in addition to the above-described LED.

Like the light emitting device, the laser diode may include a first conductive semiconductor layer, an active layer, and a second conductive semiconductor layer which have the above-described structure. Further, the laser diode uses an electro-luminescence phenomenon in which light is emitted when a current flows therein after a p-type first conductive semiconductor and an n-type second conductive semiconductor are bonded, but the laser diode has directivity and a phase of light different from those of light emitted from the light emitting device. That is, the laser diode may emit light having the same phase in the same direction at a specific single wavelength (i.e., a monochromatic beam) using a phenomenon referred to as stimulated emission and a constructive interference phenomenon, and, with the above-described characteristic, the laser diode may be used for optical communication, medical equipment, semiconductor processing equipment, and the like.

As an example of a light receiving device, there is a photodetector, which is a kind of transducer that detects light and converts intensity of the light into an electric signal. As the photodetector, there is a photoelectric cell (silicon and selenium), an optical conversion device (cadmium sulfide and cadmium selenide), a photo diode (PD) (e.g., a PD having a peak wavelength in a visible blind spectral region or a true blind spectral region), a phototransistor, a photomultiplier tube, a phototube (e.g., a vacuum and gas-filled type), an infra-red (IR) detector, and the like, but the embodiments are not limited thereto.

Further, a semiconductor device such as the photodetector may be manufactured using a direct bandgap semiconductor which generally has superior photo-conversion efficiency. Alternatively, the photodetector has a variety of structures, and includes a pin-type photodetector using a pn junction, which is the most general structure, a Schottky photodetector using a Schottky junction, and a metal-semiconductor-metal (MSM) type photodetector.

Like the light emitting device, the PD may include a first conductive semiconductor layer, an active layer, and a second conductive semiconductor layer which have the above-described structure, and may be configured with a pn junction or a pin structure. The PD operates by applying a reverse bias or a zero bias, and, when light enters the PD, electrons and holes are generated such that a current flows. At this point, a magnitude of the current may be approximately proportional to intensity of the light incident on the PD.

A photovoltaic cell or a solar cell is a kind of PD and may convert light into a current. Like the light emitting device, the solar cell may include a first conductive semiconductor layer, an active layer, and a second conductive semiconductor layer which have the above-described structure.

Further, the PD may be used as a rectifier of an electronic circuit through a rectifying characteristic of a general diode using a PN junction, and may be applied to an oscillation circuit and the like by being employed as a microwave circuit.

In addition, the above-described semiconductor device is not necessarily implemented with only a semiconductor, and may further include a metal material in some cases. For example, the semiconductor device such as the light receiving device may be implemented using at least one among Ag, Al, Au, In, Ga, N, Zn, Se, P, and As, or a semiconductor material or an intrinsic semiconductor material which is doped with a p-type or n-type dopant.

In accordance with the embodiments of the present disclosure, light absorption is suppressed in the semiconductor device such that light output can be enhanced.

Various beneficial advantages and effects of the present disclosure are not limited by the detailed description and should be easily understood through a description of a detailed embodiment of the present disclosure.

While the present disclosure has been mainly described with reference to the embodiments, and it should be understood that the present disclosure is not limited to the disclosed exemplary embodiments, and that various modifications and applications can be devised by those skilled in the art without departing from the gist of the present disclosure. For example, each component specifically shown in the embodiment can be modified and implemented. Differences related to these modifications and applications should be construed as being within the scope of the present disclosure defined by the appended claims.

Therefore, it is an objective of the present disclosure to provide a light emitting device with an improved light output.

Also, it is another objective of the present disclosure to provide a vertical ultraviolet (UV) light emitting device.

Problems to be solved in the embodiments are not limited to the above-described problems, and objects and effects which can be determined from the solutions and the embodiments of the problems that will be described below are also included in the present disclosure.

According to an aspect of the present disclosure, there is provided a semiconductor device including a light emitting structure that includes: a first semiconductor layer having aluminum; a second semiconductor layer having aluminum; and an active layer having aluminum and provided between the first semiconductor layer and the second semiconductor layer, wherein: when primary ions are bombarded on the light emitting structure to sputter away portions of the first semiconductor layer, the active layer and the second semiconductor layer, secondary ions including aluminum are produced in respective intensities for the first semiconductor layer, the active layer, and the second semiconductor layer, the intensity exhibited in the second semiconductor layer range between a first minimum intensity of the secondary ions and a first maximum intensity of the secondary ions, and the intensity exhibited in the first semiconductor layer include a second minimum intensity of the secondary ions, the second minimum intensity being different from the first minimum intensity, and at a first prescribed distance from a surface of the second semiconductor layer, the second semiconductor layer exhibits a first intermediate intensity of the secondary ions corresponding to the second minimum intensity, which is between the first minimum intensity and the first maximum intensity, wherein the first maximum intensity occurs at a second prescribed distance from the first prescribed distance, wherein a ratio of the second prescribed distance (W1) to the first prescribed distance (W2) is within a range of 1:0.2 to 1:1.

The first intensity difference (D1) between the first maximum intensity and the second minimum intensity is greater than a second intensity difference (D2) between the first minimum intensity and the second minimum intensity.

A ratio of the first intensity difference to the second intensity difference ranges from 1:0.2 to 1:2.

The intensity exhibited in the second semiconductor layer between the first minimum intensity and the first intermediate intensity includes two intensity peaks and an intensity valley between the two intensity peaks.

The intensity at the two intensity peaks is higher than the intensity at the intensity valley.

The second semiconductor layer is an P-type semiconductor layer and a blocking layer, and the first semiconductor layer is a N-type semiconductor layer.

The first semiconductor layer exhibits a second maximum intensity at a portion of the first semiconductor layer closest to the active layer.

The intensity exhibited in the active layer is lower than the first and second maximum intensities and are higher than the first and second minimum intensities.

The intensity exhibited in the active layer includes a plurality of peaks and a plurality of valleys.

The intensity exhibited in the peaks of the active layer is greater than the intensity exhibited in the valleys of the active layer.

The second semiconductor layer includes a first surface on which the second electrode is positioned, the first surface being positioned opposite the active layer, the second semiconductor layer exhibits the first minimum intensity at the first surface.

The second semiconductor layer includes a blocking layer provided as a portion of the second semiconductor layer closest to the active layer.

The first maximum intensity is exhibited in the blocking layer.

The active layer includes one of a single-well structure, a multi-well structure, a single-quantum-well structure, a multi-quantum-well (MQW) structure, a quantum dot structure, or a quantum wire structure.

The active layer includes a plurality of well layers and a plurality of barrier layers that are alternately provided in the active layer.

The first semiconductor layer includes a first sublayer, a second sublayer, and a third sublayer, wherein the second sublayer is between the first sublayer and the third sublayer, wherein an aluminum composition of the second sublayer is lower than an aluminum composition of the third sublayer, wherein the aluminum composition of the second sublayer is in a range of 30% to 60%.

The second semiconductor layer includes a first sublayer in contact with an electrode, a second sublayer, and a third sublayer between the active layer and the second sublayer, wherein an aluminum composition of each of the first sublayer, the second sublayer and the third sublayer decreases away from the active layer.

The secondary ions further include at least one of gallium, nitrogen, or carbon.

The first semiconductor layer includes a first semiconductor material having an empirical formula $In_{x1}Al_{y1}Ga_{1-x1-y1}N$ ($0 \le x1 \le 1$, $0 \le y1 \le 1$, and $0 \le x1+y1 \le 1$), and the second semiconductor layer includes a second semiconductor material having an empirical formula $In_{x5}Al_{y2}Ga_{1-x5-y2}N$ ($0 \le x5 \le 1$, $0 \le y2 \le 1$, and $0 \le x5+y2 \le 1$).

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device comprising:
   a light emitting structure that includes:
      a first semiconductor layer having aluminum;
      a second semiconductor layer having aluminum; and
      an active layer having aluminum and provided between the first semiconductor layer and the second semiconductor layer,
   wherein:
      when primary ions are bombarded on the light emitting structure to sputter away portions of the first semiconductor layer, the active layer and the second semiconductor layer, secondary ions including aluminum are produced in respective intensities for the first semiconductor layer, the active layer, and the second semiconductor layer,
      the intensity exhibited in the second semiconductor layer range between a first minimum intensity of the secondary ions and a first maximum intensity of the secondary ions, and
      the intensity exhibited in the first semiconductor layer include a second minimum intensity of the secondary ions, the second minimum intensity being greater than the first minimum intensity, and
      at a first prescribed distance from a surface of the second semiconductor layer, the second semiconductor layer exhibits a first intermediate intensity of the secondary ions corresponding to the second minimum intensity, which is between the first minimum intensity and the first maximum intensity, wherein the first maximum intensity occurs at a second prescribed distance from the first prescribed distance,
      wherein the first minimum intensity of the secondary ions is exhibited at the surface of the second semiconductor layer furthest from the active layer, and the first maximum intensity of the secondary ions is exhibited at a first location of the second semiconductor layer closer to the active layer than the surface of the second semiconductor layer, and the first intermediate intensity of the secondary ions is exhibited at a second location of the second semiconductor layer between the surface of the second semiconductor layer and the first location of the second semiconductor layer,
      wherein intensity of aluminum at the second location of the second semiconductor layer is greater than intensity of aluminum at the surface of the second semiconductor layer, and intensity of aluminum at the first location of the second semiconductor layer is greater than intensity of aluminum at the second location of the second semiconductor layer,
      wherein a ratio of the second prescribed distance (W1) to the first prescribed distance (W2) is within a range of 1:0.2 to 1:1,
      wherein the first maximum intensity of the secondary ions is the greatest intensity of the secondary ions produced from the light emitting structure,
      wherein the first semiconductor layer exhibits a second maximum intensity of the secondary ions which is smaller than the first maximum intensity and which is the greatest intensity in a region between the first maximum intensity and the second minimum intensity,
      wherein the active layer is disposed between the first maximum intensity and the second maximum intensity, and
      wherein the intensities exhibited in the active layer are smaller than the first and second maximum intensities and are greater than the first and second minimum intensities.

2. The semiconductor device of claim 1, wherein a first intensity difference (D1) between the first maximum intensity and the second minimum intensity is greater than a second intensity difference (D2) between the first minimum intensity and the second minimum intensity.

3. The semiconductor device of claim 2, wherein a ratio of the first intensity difference to the second intensity difference ranges from 1:0.2 to 1:2.

4. The semiconductor device of claim 1, wherein the second semiconductor layer is an P-type semiconductor layer and a blocking layer, and the first semiconductor layer is a N-type semiconductor layer.

5. The semiconductor device of claim 1, wherein the intensity exhibited in the active layer includes a plurality of peaks and a plurality of valleys.

6. The semiconductor device of claim 5, wherein the intensity exhibited in the peaks of the active layer is greater than the intensity exhibited in the valleys of the active layer.

7. The semiconductor device of claim 1, further comprising:
   a first electrode electrically connected with the first semiconductor layer,
   a second electrode electrically connected with the second semiconductor layer; and
   wherein:
      the second semiconductor layer includes a first surface on which the second electrode is positioned, the first surface being positioned opposite the active layer;
      the second semiconductor layer exhibits the first minimum intensity at the first surface.

8. The semiconductor device of claim 1, wherein the second semiconductor layer includes a blocking layer provided as a portion of the second semiconductor layer closest to the active layer.

9. The semiconductor device of claim 8, wherein the first maximum intensity is exhibited in the blocking layer.

10. The semiconductor device of claim 1, wherein the active layer includes one of a single-well structure, a multi-well structure, a single-quantum-well structure, a multi-quantum-well (MQW) structure, a quantum dot structure, or a quantum wire structure.

11. The semiconductor device of claim 1, wherein the active layer includes a plurality of well layers and a plurality of barrier layers that are alternately provided in the active layer.

12. The semiconductor device of claim 1, wherein the first semiconductor layer includes a first sublayer, a second sublayer, and a third sublayer, wherein the second sublayer is between the first sublayer and the third sublayer,
wherein an aluminum composition of the second sublayer is lower than an aluminum composition of the third sublayer,
wherein the aluminum composition of the second sublayer is in a range of 30% to 60%.

13. The semiconductor device of claim 1, wherein the second semiconductor layer includes a first sublayer in contact with an electrode, a second sublayer, and a third sublayer between the active layer and the second sublayer, wherein an aluminum composition of each of the first sublayer, the second sublayer and the third sublayer decreases away from the active layer.

14. The semiconductor device of claim 1, wherein the secondary ions further include at least one of gallium, nitrogen, or carbon.

15. The semiconductor device of claim 1, wherein the first semiconductor layer includes a first semiconductor material having an empirical formula $In_{x1}Al_{y1}Ga_{a1-x1-y1}N$ ($0 \leq x1 \leq 1$, $0 \leq y1 \leq 1$, and $0 \leq x1+y1 \leq 1$), and the second semiconductor layer includes a second semiconductor material having an empirical formula $In_{x5}Al_{y2}Ga_{1-x5-y2}N$ ($0 \leq x5 \leq 1$, $0 \leq y2 \leq 1$, and $0 \leq x5+y2 \leq 1$).

16. A semiconductor device package comprising:
a body; and
a semiconductor device disposed on the body, wherein the semiconductor device has a light emitting structure including:
a first semiconductor layer having aluminum;
a second semiconductor layer having aluminum; and
an active layer having aluminum and provided between the first semiconductor layer and the second semiconductor layer,
wherein:
when primary ions are bombarded on the light emitting structure to sputter away portions of the first semiconductor layer, the active layer and the second semiconductor layer, secondary ions including aluminum are produced in respective intensities for the first semiconductor layer, the active layer, and the second semiconductor layer,
the intensity exhibited in the second semiconductor layer range between a first minimum intensity of the secondary ions and a first maximum intensity of the secondary ions, and
the intensity exhibited in the first semiconductor layer include a second minimum intensity of the secondary ions, the second minimum intensity being different from the first minimum intensity, and
at a first prescribed distance from a surface of the second semiconductor layer, the second semiconductor layer exhibits a first intermediate intensity of the secondary ions corresponding to the second minimum intensity, which is between the first minimum intensity and the first maximum intensity, wherein the first maximum intensity occurs at a second prescribed distance from the first prescribed distance,
wherein the first minimum intensity of the secondary ions is exhibited at the surface of the second semiconductor layer furthest from the active layer, and the first maximum intensity of the secondary ions is exhibited at a first location of the second semiconductor layer closer to the active layer than the surface of the second semiconductor layer, and the first intermediate intensity of the secondary ions is exhibited at a second location of the second semiconductor layer between the surface of the second semiconductor layer and the first location of the second semiconductor layer,
wherein intensity of aluminum at the second location of the second semiconductor layer is greater than intensity of aluminum at the surface of the second semiconductor layer, and intensity of aluminum at the first location of the second semiconductor layer is greater than intensity of aluminum at the second location of the second semiconductor layer,
wherein a ratio of the second prescribed distance (W1) to the first prescribed distance (W2) is within a range of 1:0.2 to 1:1,
wherein the first maximum intensity of the secondary ions is the greatest intensity of the secondary ions produced from the light emitting structure,
wherein the first semiconductor layer exhibits a second maximum intensity of the secondary ions which is smaller than the first maximum intensity and which is the greatest intensity in a region between the first maximum intensity and the second minimum intensity,
wherein the active layer is disposed between the first maximum intensity and the second maximum intensity, and
wherein the intensities exhibited in the active layer are smaller than the first and second maximum intensities and are greater than the first and second minimum intensities.

17. The semiconductor device of claim 1, wherein the intensity of the secondary ions exhibited in the second semiconductor layer between the first minimum intensity and the first intermediate intensity includes two intensity peaks and an intensity valley between the two intensity peaks, and
wherein the intensity of the secondary ions at the two intensity peaks is higher than the intensity of the secondary ions at the intensity valley,
wherein the two intensity peaks include a first intensity peak and a second intensity peak, the second intensity peak being closer to the active layer than the first intensity peak, and
the intensity of the secondary ions at the second intensity peak is higher than the intensity of the secondary ions at the first intensity peak, and
the intensity of the secondary ions at the intensity valley is less than the intensity of the secondary ions at the first intensity peak.

18. The semiconductor device package of claim 16, wherein the intensity of the secondary ions exhibited in the second semiconductor layer between the first minimum intensity and the first intermediate intensity includes two intensity peaks and an intensity valley between the two intensity peaks, and
wherein the intensity of the secondary ions at the two intensity peaks is higher than the intensity of the secondary ions at the intensity valley
wherein the two intensity peaks include a first intensity peak and a second intensity peak, the second intensity peak being closer to the active layer than the first intensity peak, and
the intensity of the secondary ions at the second intensity peak is higher than the intensity of the secondary ions at the first intensity peak, and the intensity of the secondary ions at the intensity valley is less than the intensity of the secondary ions at the first intensity peak.

\* \* \* \* \*